(12) United States Patent
Tsai et al.

(10) Patent No.: US 8,319,525 B2
(45) Date of Patent: Nov. 27, 2012

(54) FLIP-FLOP CIRCUIT AND LEAKAGE CURRENT SUPPRESSION CIRCUIT UTILIZED IN A FLIP-FLOP CIRCUIT

(75) Inventors: Yun-Ta Tsai, Taipei (TW); Shen-Iuan Liu, Taipei (TW)

(73) Assignee: National Taiwan University, Taipei (TW)

( * ) Notice: Subject to any disclaimer, the term of this patent is extended or adjusted under 35 U.S.C. 154(b) by 119 days.

(21) Appl. No.: 12/939,150

(22) Filed: Nov. 3, 2010

(65) Prior Publication Data
US 2011/0241745 A1    Oct. 6, 2011

(30) Foreign Application Priority Data
Apr. 2, 2010  (TW) ................................ 99110305 A

(51) Int. Cl.
*H03D 1/00* (2006.01)
(52) U.S. Cl. ............ 327/50; 327/199; 327/309; 327/362
(58) Field of Classification Search .................... 327/50, 327/199, 218, 292, 317, 362, 378, 309; 714/746
See application file for complete search history.

(56) References Cited

U.S. PATENT DOCUMENTS
5,818,268 A * 10/1998 Kim et al. ...................... 327/77
* cited by examiner

*Primary Examiner* — Long Nguyen
(74) *Attorney, Agent, or Firm* — Wang Law Firm, Inc.; Li K. Wang; Stephen Hsu

(57) ABSTRACT

A flip-flop circuit includes a D flip-flop and a leakage current suppression circuit. The D flip-flop receives an input signal and a clock signal, and outputs a voltage of the input signal at a rising or falling edge of the clock signal as an output signal. The leakage current suppression circuit detects an output error caused by the leakage current flowing through at least a floating node of the D flip-flop and compensates for the leakage current to correct the output error. The leakage current suppression circuit includes a detection circuit and a compensation circuit. The detection circuit receives the output signal and clock signal and detects whether the output error has occurred to generate a detection result. The compensation circuit compensates for the leakage current according to the detection result to correct the output error.

10 Claims, 16 Drawing Sheets

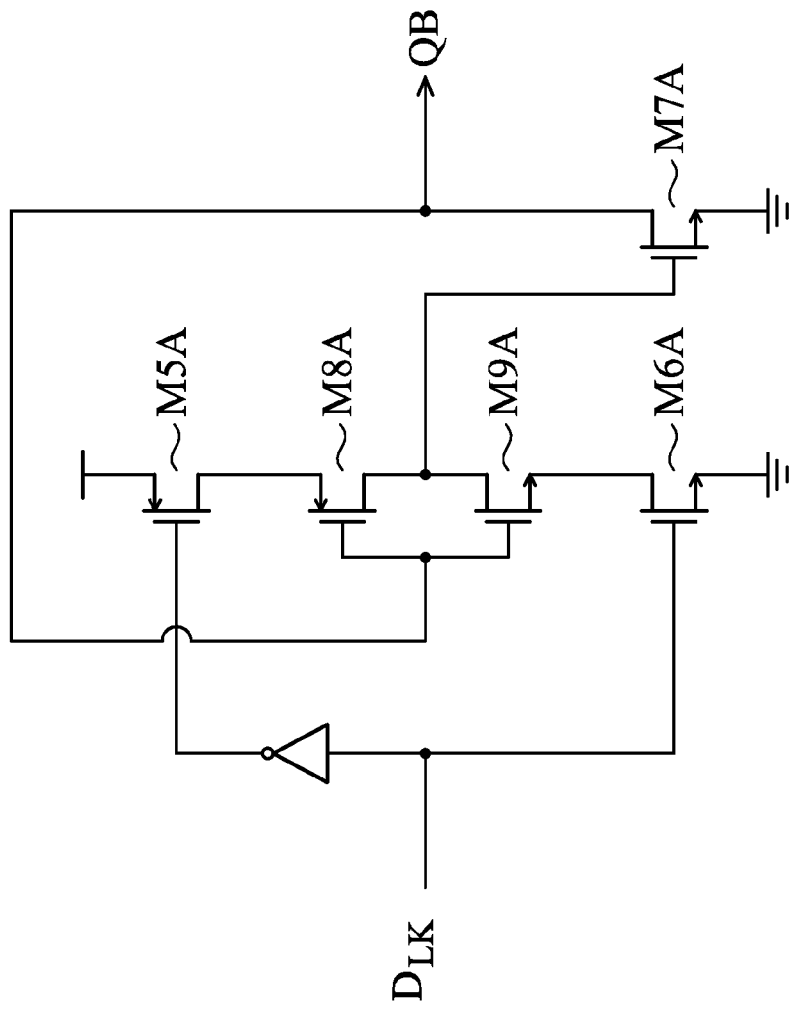

FLIP-FLOP CIRCUIT AND LEAKAGE CURRENT SUPPRESSION CIRCUIT UTILIZED IN A FLIP-FLOP CIRCUIT

CROSS REFERENCE TO RELATED APPLICATIONS

This Application claims priority of Taiwan Patent Application No. 099110305, filed on Apr. 2, 2010, the entirety of which is incorporated by reference herein.

BACKGROUND OF THE INVENTION

1. Field of the Invention

The invention relates to a detection and compensation circuit, and more particularly to a circuit performing automatic leakage current detection and compensation.

2. Description of the Related Art

For a dynamic circuit, output errors generally occur due to leakage current at a floating node of the dynamic circuit. Here, the floating node is the node in the circuit without operating current directly passing therethrough. FIG. 1 shows a conventional D flip-flop (DFF). As shown in FIG. 1, the DFF receives an input signal D and a clock signal CLK, outputs the current voltage of the input signal D as the output signal Q at the rising (or falling) edge of clock signal CLK, and outputs an inverse of the input signal D as another output signal QB. FIG. 2 shows a detailed circuit diagram of a conventional True Single Phase Clock (TSPC) DFF. As shown in FIG. 2, when the clock signal CLK is 0, the transistors M1 and M3 are turned off. That is, the output node QB is now a floating node. Suppose that the original status at output node QB is 0, then leakage current would begin to charge the output node QB from the voltage source, to eventually change the status at the output node QB to 1 so that an erroneous output is generated (Q=0).

Since the amount of leakage current in advanced processes is already too large to be neglected, besides, the amount of leakage current is also large when the DFF is operated in low frequency, a circuit performing automatic leakage current detection and compensation is highly required so as to correct the effect caused by leakage current.

BRIEF SUMMARY OF THE INVENTION

A flip-flop circuit and leakage current suppression circuit utilized in a flip-flop circuit are provided. An exemplary embodiment of a flip-flop circuit comprises a D flip-flop (DFF) and a leakage current suppression circuit. The DFF receives an input signal and a clock signal and outputs a voltage of the input signal as an output signal at a rising or falling edge of the clock signal. The leakage current suppression circuit detects an output error caused by leakage current flowing through at least a floating node of the DFF and compensates for the leakage current so as to correct the output error. The leakage current suppression circuit comprises a detection circuit and a compensation circuit. The detection circuit receives the output signal and the clock signal, and detects whether the output error has occurred, to generate a detection result. The compensation circuit compensates for the leakage current according to the detection result to correct the output error.

Another exemplary embodiment of a leakage current suppression circuit for detecting an output error caused by leakage current flowing through at least a floating node of a D Flip-flop (DFF) and compensating for the leakage current so as to correct the output error comprises a detection circuit and a compensation circuit. The detection circuit receives an output signal and a clock signal of the DFF, and detects whether the output error has occurred, to generate a detection result. The detection circuit comprises a first pulse generator, a second pulse generator, a first switch and a second switch. The first pulse generator generates a plurality of first pulses according to the clock signal. The second pulse generator generates a plurality of second pulses according to the output signal. The first switch is coupled between a first supply voltage and a detection node and turned on or off according to a voltage of the output signal. The second switch is coupled between a second supply voltage and the detection node and turned on or off according to voltages of the plurality of first pulses and the plurality of second pulses. The detection circuit generates the detection result at the detection node according to on/off statuses of the first and second switches. The compensation circuit compensates for the leakage current according to the detection result to correct the output error.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein:

FIG. 7B shows the detailed circuit diagram of the first stage of the compensation circuit according to an embodiment of the invention;

DETAILED DESCRIPTION OF THE INVENTION

The following description is of the best-contemplated mode of carrying out the invention. This description is made for the purpose of illustrating the general principles of the invention and is not taken in a limiting sense. The scope of the invention is best determined by reference to the appended claims.

Figure 2:
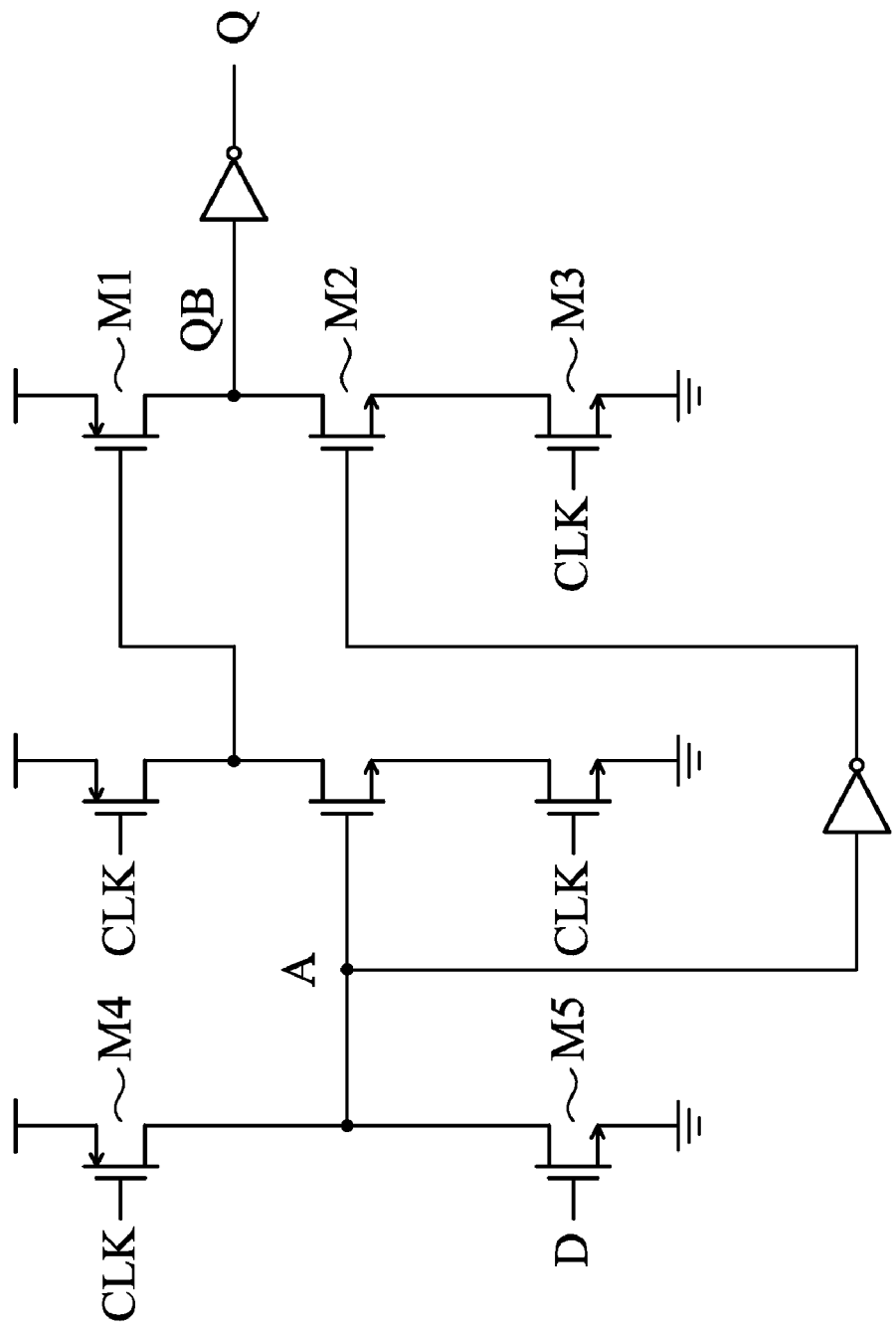
FIG. 2 shows a detailed circuit diagram of a conventional True Single Phase Clock (TSPC) DFF.
Figure 3:
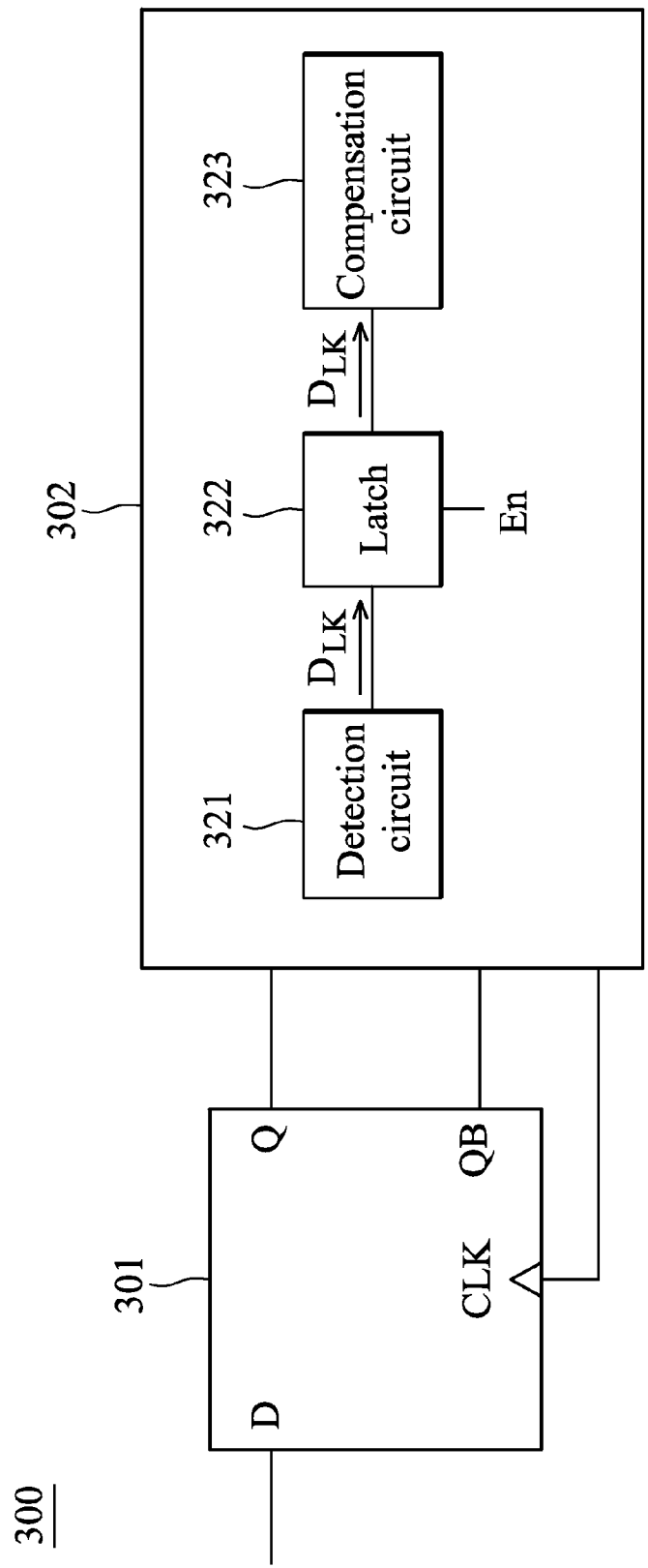
FIG. 3 is a block diagram showing a flip-flop circuit according to an embodiment of the invention.

FIG. 3 is a block diagram showing a flip-flop circuit according to an embodiment of the invention. The flip-flop circuit 300 comprises a D flip-flop (DFF) 301 receiving an input signal D and a clock signal CLK and outputting a voltage of the input signal D as an output signal Q at a rising or falling edge of the clock signal CLK. The DFF 301 may be a True Single Phase Clock (TSPC) DFF as shown in FIG. 2, or any other type of the DFF, and the invention is not limited thereto. According to an embodiment of the invention, in order to correct the output error caused by leakage current, the flip-flop circuit 300 further comprises a leakage current suppression circuit 302 for detecting the output error caused by leakage current flowing through at least a floating node of the DFF 301 and compensating for the leakage current so as to correct the output error of the DFF. According to an embodiment of the invention, the leakage current suppression circuit 302 may comprise a detection circuit 321 and a compensation circuit 323. The detection circuit 321 receives the output signal Q and the clock signal CLK of the DFF 301, and detects whether the output error of the DFF 301 has occurred, to generate a detection result $D_{LK}$. The compensation circuit 323 compensates for the leakage current according to the detection result $D_{LK}$ to correct the output error of the DFF 301. According to another embodiment of the invention, the leakage current suppression circuit 302 may further comprise a latch 322 coupled between the detection circuit 231 and the compensation circuit 323 to output the detection result $D_{LK}$ to the compensation circuit 323 according to an enable signal En.

Figure 4:
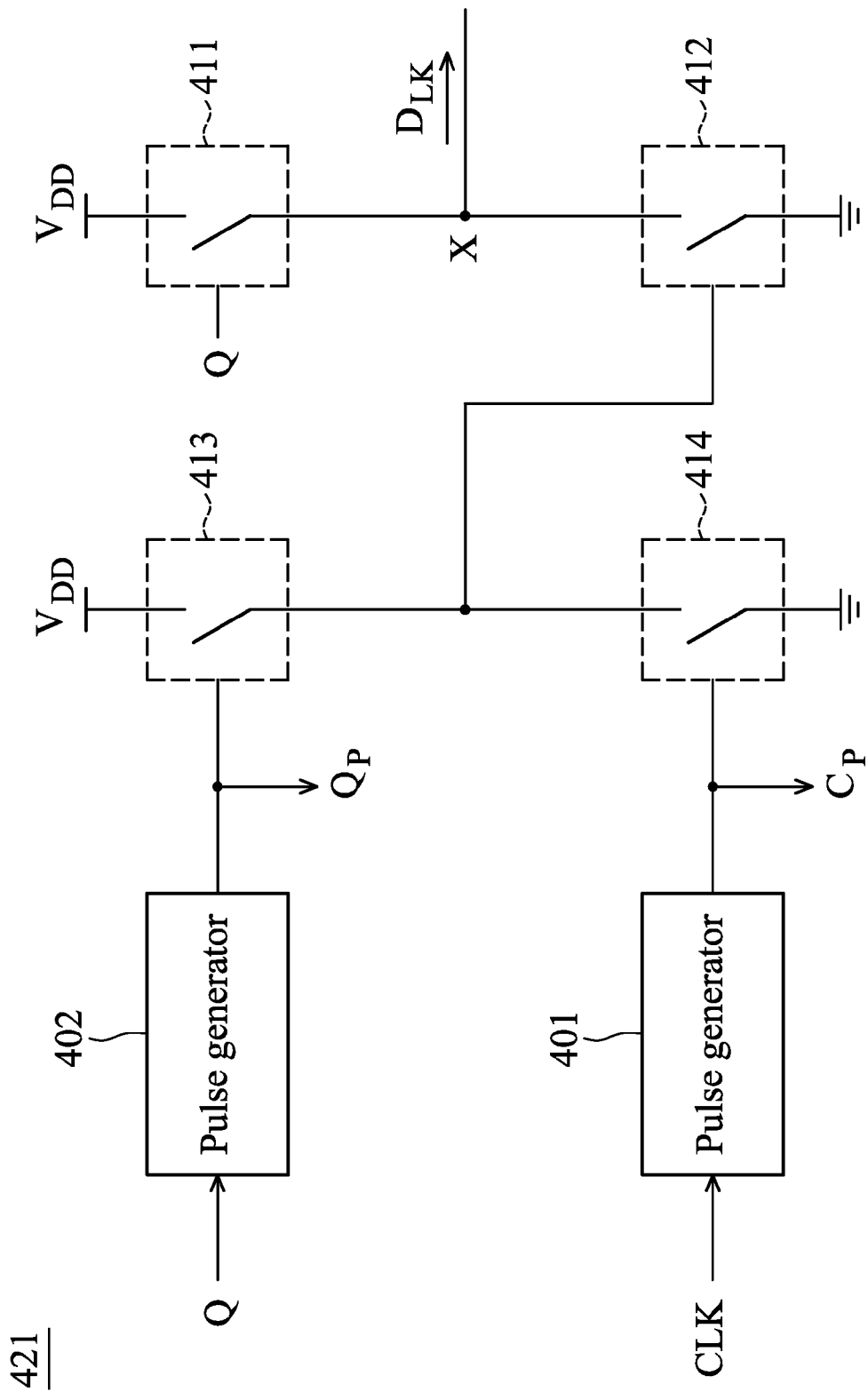
FIG. 4 shows a block diagram of a detection circuit according to an embodiment of the invention.

FIG. 4 shows a block diagram of a detection circuit according to an embodiment of the invention. The detection circuit 421 may comprise a plurality of pulse generators 401 and 402 and a plurality of switches 411 to 414. The pulse generator 401 generates the pulse signal $C_P$ having a plurality of first pulses according to the clock signal CLK. The pulse generator 402 generates the pulse signal $Q_P$ having a plurality of second pulses according to the output signal Q of the DFF. The switch 411 is coupled between a supply voltage VDD and a detection node X and turned on or off according to a voltage of the output signal Q. The switch 412 is coupled between the ground and the detection node X and turned on or off according to voltages of the plurality of first pulses and the plurality of second pulses. The switch 413 is coupled between the supply voltage $V_{DD}$ and the switch 412 and turned on or off according to the voltages of the first pulses. The switch 414 is coupled between the ground and the switch 412 and turned on or off according to the voltages of the second pulses. As shown in the figure, the on/off statuses of the switches 413 and 414 are first determined according to the voltages of the first pulses and the second pulses, so as to selectively couple the supply voltage VDD or the ground to the switch 412; thereby changing the on/off status of the switch 412. The detection circuit 421 is selectively coupled the detection node X to the supply voltage VDD or the ground according to the on/off statues of the switches 411 and 412 to generate the detection result $D_{LK}$ at the detection node X.

Figure 5:
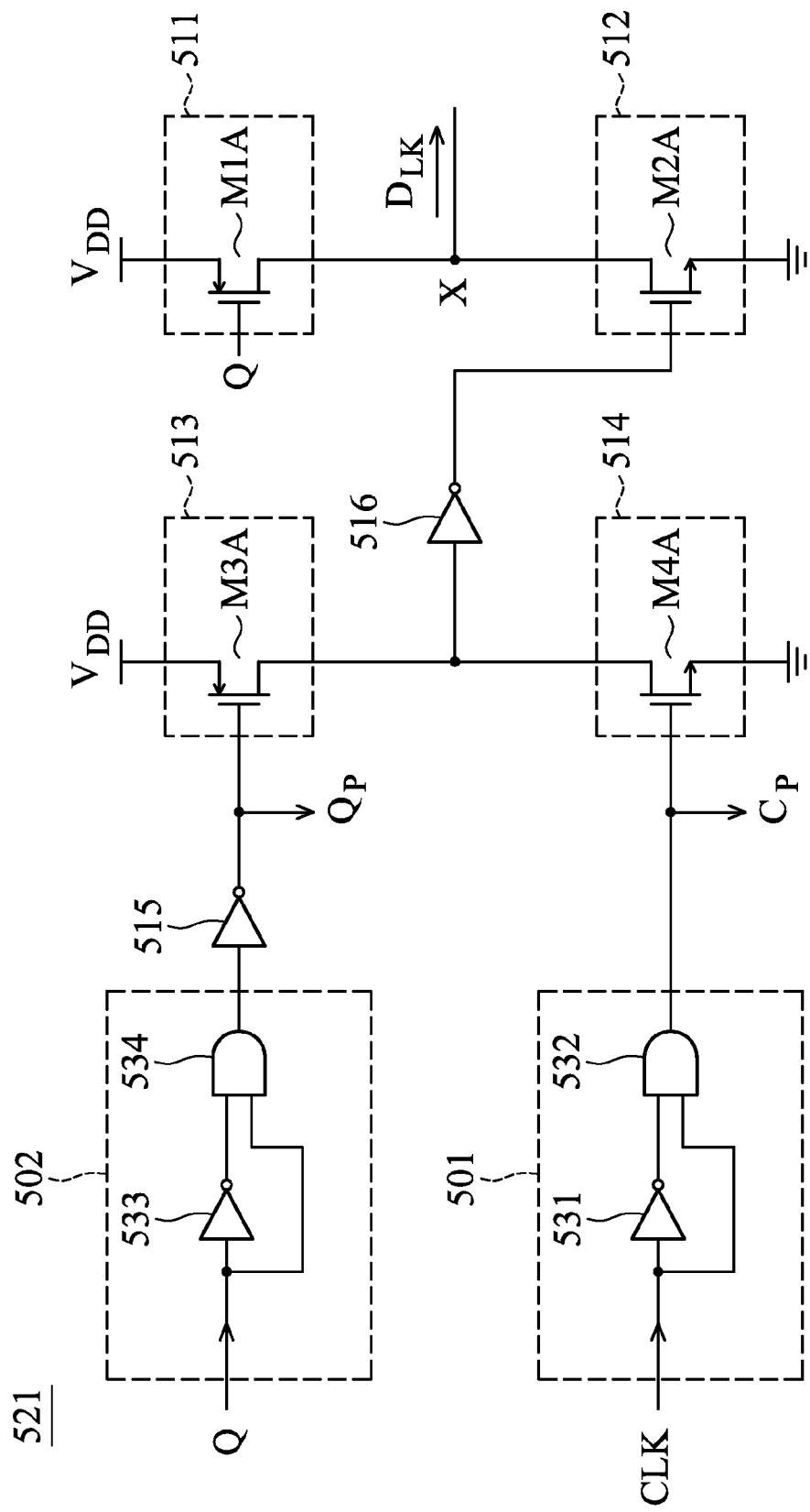
FIG. 5 shows a detailed circuit diagram of the detection circuit according to an embodiment of the invention.

FIG. 5 shows a detailed circuit diagram of the detection circuit according to an embodiment of the invention. According to an embodiment of the invention, the switches 511-514 may respectively be a transistor, and the pulse generators 501 and 502 may respectively comprise inverters 531 and 533 and logic gates 532 and 534. The inverters 531 and 533 respectively receive the clock signal CLK and the output signal Q. The logic gates 532 and 534 respectively performs a logic operation according to the clock signal CLK and an output signal of the inverter 531, and the output signal Q and an output signal of the inverter 533, so as to generate the pulse signals $C_P$ and $Q_P$. Note that according to the properties of transistor, the detection circuit 521 may further comprise inverters 515 and 516 so as to adequately control the on/off statuses of the transistors M3A and M2A. According to other embodiments of the invention, when different types of transistors M3A and M2A are utilized, the inverters 515 and 516 may be omitted: therefore, the invention is not limited thereto.

Figure 6:
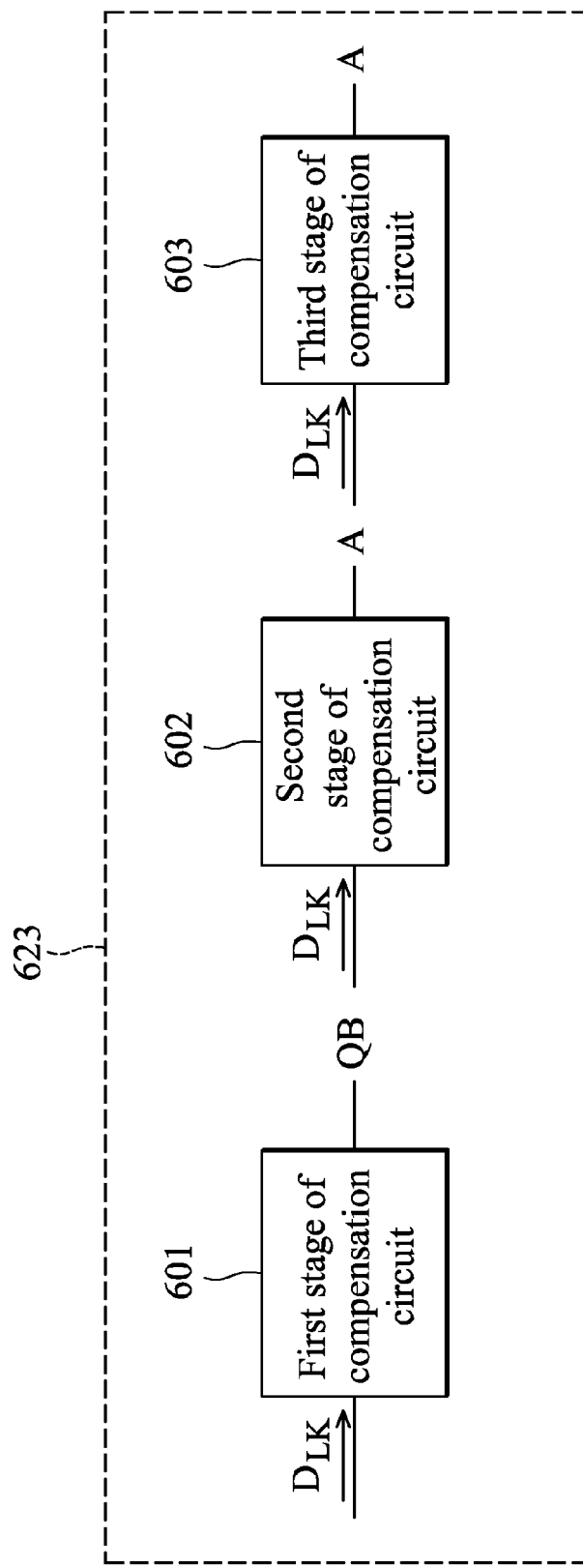
FIG. 6 shows a block diagram of a compensation circuit according to an embodiment of the invention.

FIG. 6 shows a block diagram of a compensation circuit according to an embodiment of the invention. According to the embodiment of the invention, the compensation circuit 623 may comprise one or more stages of the compensation circuits 601-603. The first stage of the compensation circuit 601 may be utilized to compensate for the leakage current flowing through the inverse output terminal QB of the DFF, and the second and third stages of the compensation circuits 602 and 603 may be utilized to compensate for the leakage current flowing through another floating node (for example, the node A shown in FIG. 2) of the DFF. Since the leakage current flowing through the other floating nodes of the DFF may also erroneously discharge the voltage at the floating nodes from 1 to 0 (for example, discharge the voltage at node A through the transistor M5) or erroneously charge the voltage at the floating nodes from 0 to 1 (for example, charge the voltage at node A through the transistor M4). Therefore, according to an embodiment of the invention, a plurality of stages of the compensation circuits may be further coupled to different floating nodes, when required, so as to compensate for the leakage current flowing through the floating nodes.

Figure 7A:
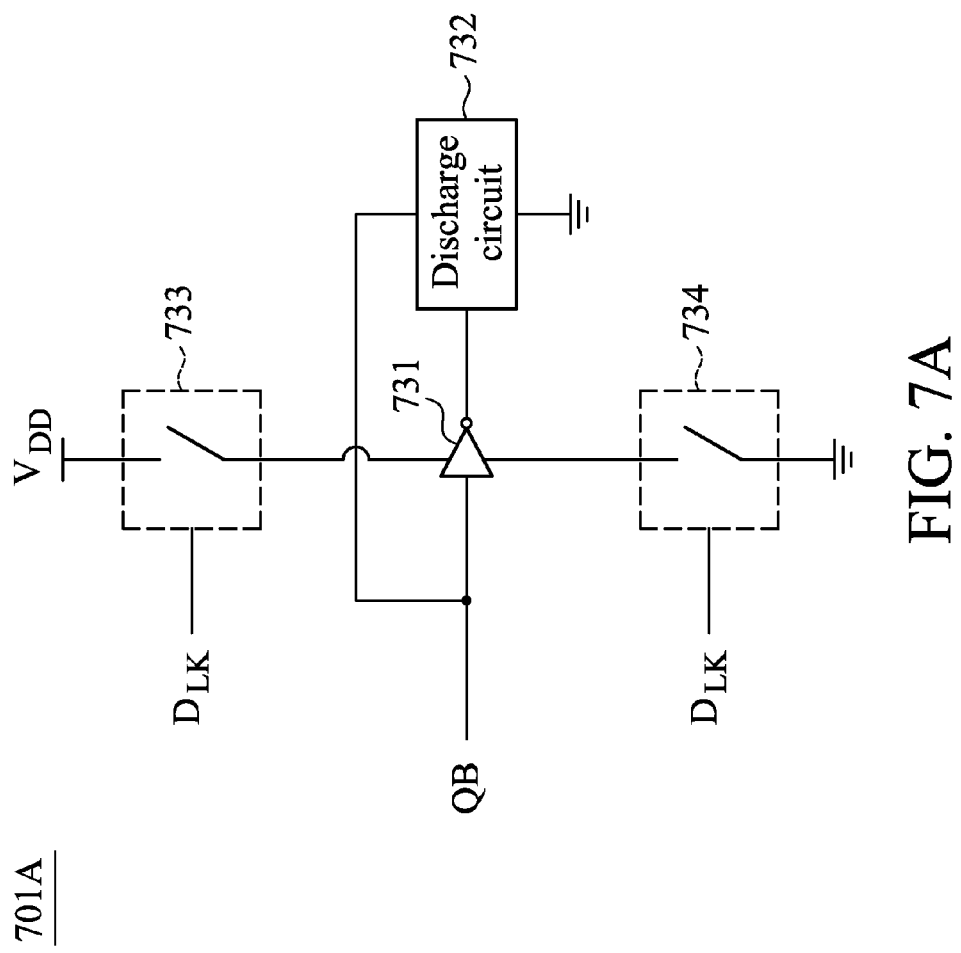
FIG. 7A shows the first stage of the compensation circuit according to an embodiment of the invention.

FIG. 7A shows the first stage of the compensation circuit according to an embodiment of the invention. The first stage of the compensation circuit 701A comprises an inverter 731, a discharge circuit 732 and the switches 733 and 734. The inverter 731 is coupled to the inverse output terminal of the DFF for receiving the inverse output signal QB of the DFF. The switch 733 is coupled between the supply voltage $V_{DD}$ and the inverter 731. The switch 734 is coupled between the ground and the inverter 731, wherein the switches 733 and 734 are respectively turned on or off according to the detection result $D_{LK}$ so as to turn on or off the inverter 731. When the detection result indicates that the output error has already occurred, the switches 733 and 734 are turned on; thereby activating (i.e. turning on) the inverter 731. The output of inverter 731 further activates the discharge circuit 732 so as to discharge the voltage at the inverse output terminal and reset the inverse output signal QB. That is, the erroneous voltage at the inverse output terminal, which was charged from logic 0 to logic 1 due to the leakage current, is discharged back to logic 0.

FIG. 7B shows the detailed circuit diagram of the first stage of the compensation circuit according to an embodiment of the invention. As shown in the figure, the switches in the first stage of the compensation circuit 701B may respectively be the transistors M5A and M6A, which are turned on or off according to the detection result $D_{LK}$. The transistors M8A and M9A forms an inverter and the discharge circuit 732 may further comprise a transistor M7A, which is turned on according to an output signal of the inverter so as to discharge the voltage of the inverse output signal QB back to logic 0. Note that the size of transistor M7A is preferably small to avoid influencing the normal operations of the DFF.

Figure 8A:
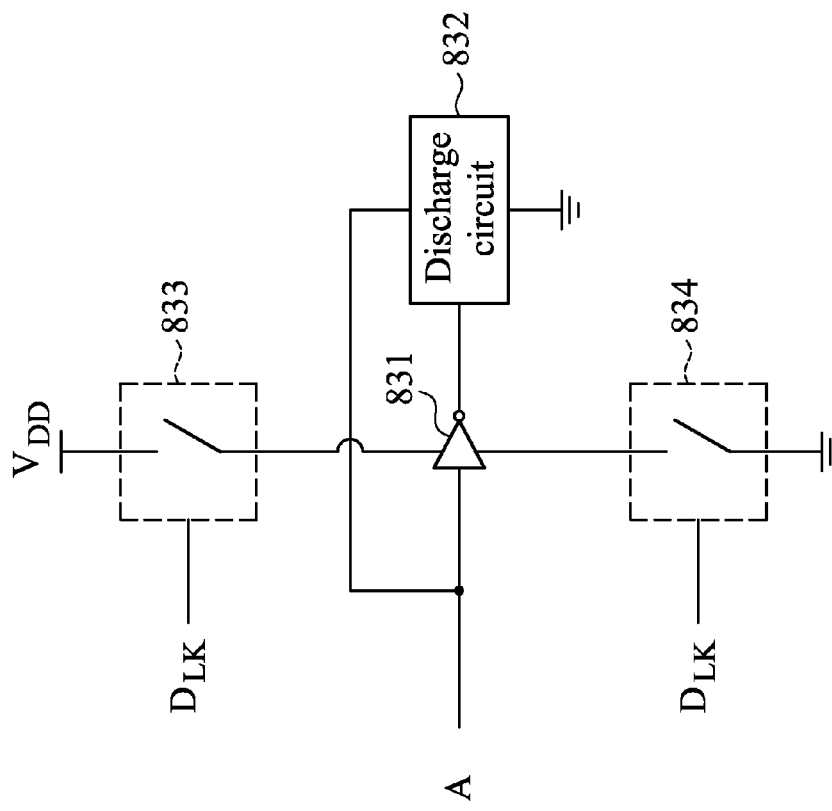
FIG. 8A shows a schematic diagram of a second stage of the compensation circuit according to an embodiment of the invention.

FIG. 8A shows a schematic diagram of a second stage of the compensation circuit according to an embodiment of the invention. Structure of the second stage of the compensation circuit 802 is similar to that of the first stage of the compensation circuits 701A and 701B, and comprises the inverter 831, the discharge circuit 832 and switches 833 and 834. The inverter 831 is coupled to the floating node A of the DFF. The switch 833 is coupled between the supply voltage $V_{DD}$ and the inverter 831. The switch 834 is coupled between the ground and the inverter 831, wherein the switches 833 and 834 are turned on or off according to the detection result $D_{LK}$ so as to turn on or off the inverter 831. When the detection result indicates that the output error has already occurred, the switches 833 and 834 are turned on so as to activate the inverter 831. The output result of the inverter 831 may further activate the discharge circuit 832 to discharge the voltage at the floating node A so as to reset the voltage at the floating node A. That is, the erroneous voltage at the floating node, which was charged from logic 0 to logic 1 due to the leakage current, is discharged back to logic 0.

Figure 8B:
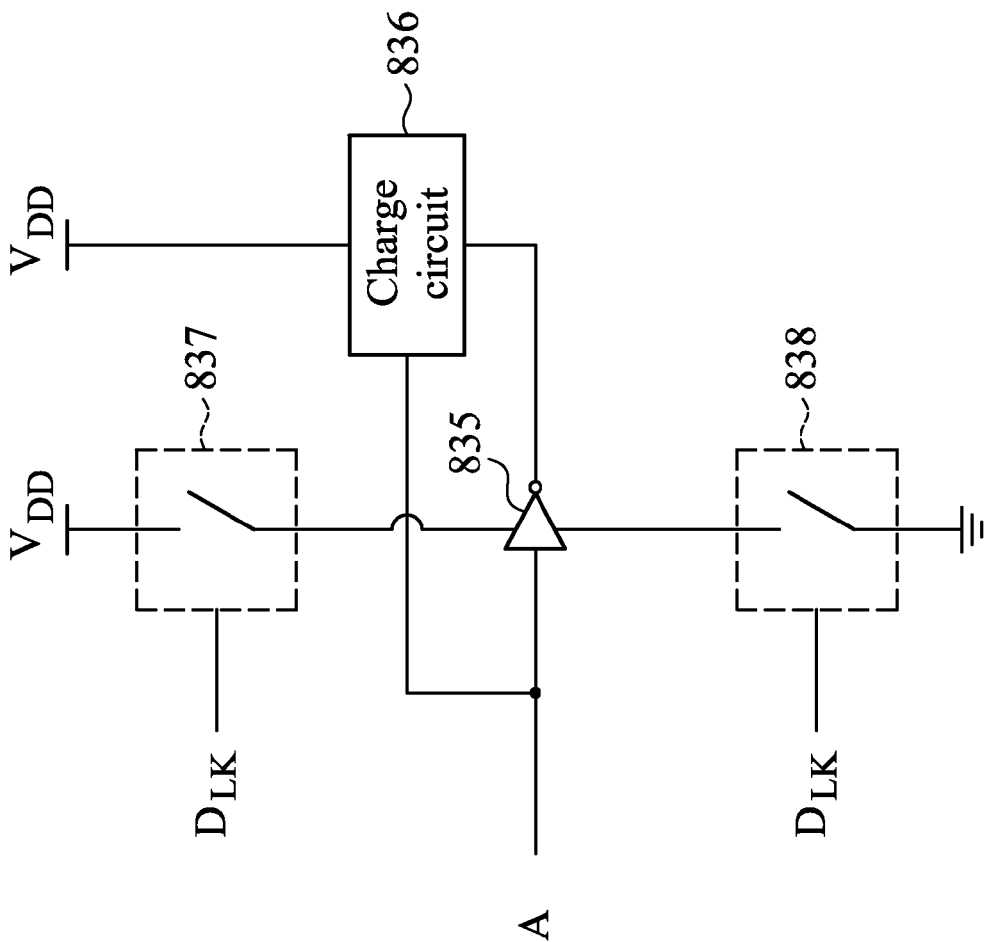
FIG. 8B shows a schematic diagram of a third stage of the compensation circuit according to an embodiment of the invention.

FIG. 8B shows a schematic diagram of a third stage of the compensation circuit according to an embodiment of the invention. The third stage of the compensation circuit 803 comprises the inverter 835, the charge circuit 836 and switches 837 and 838. The inverter 835 is coupled to the floating node A of the DFF. The switch 837 is coupled between the supply voltage $V_{DD}$ and the inverter 835. The switch 838 is coupled between the ground and the inverter 835, wherein the switches 837 and 838 are turned or off according to the detection result $D_{LK}$ so as to turn on or off the inverter 835. When the detection result indicates that the output error has already occurred, the switches 837 and 838 are turned on so as to activate the inverter 835. The output result of inverter 835 further activates the charge circuit 836 to charge the voltage at the floating node A; thereby resetting the erroneous voltage at the floating node A, which was discharged from logic 1 to logic 0 due to the leakage current, back to logic 1.

Figure 9:
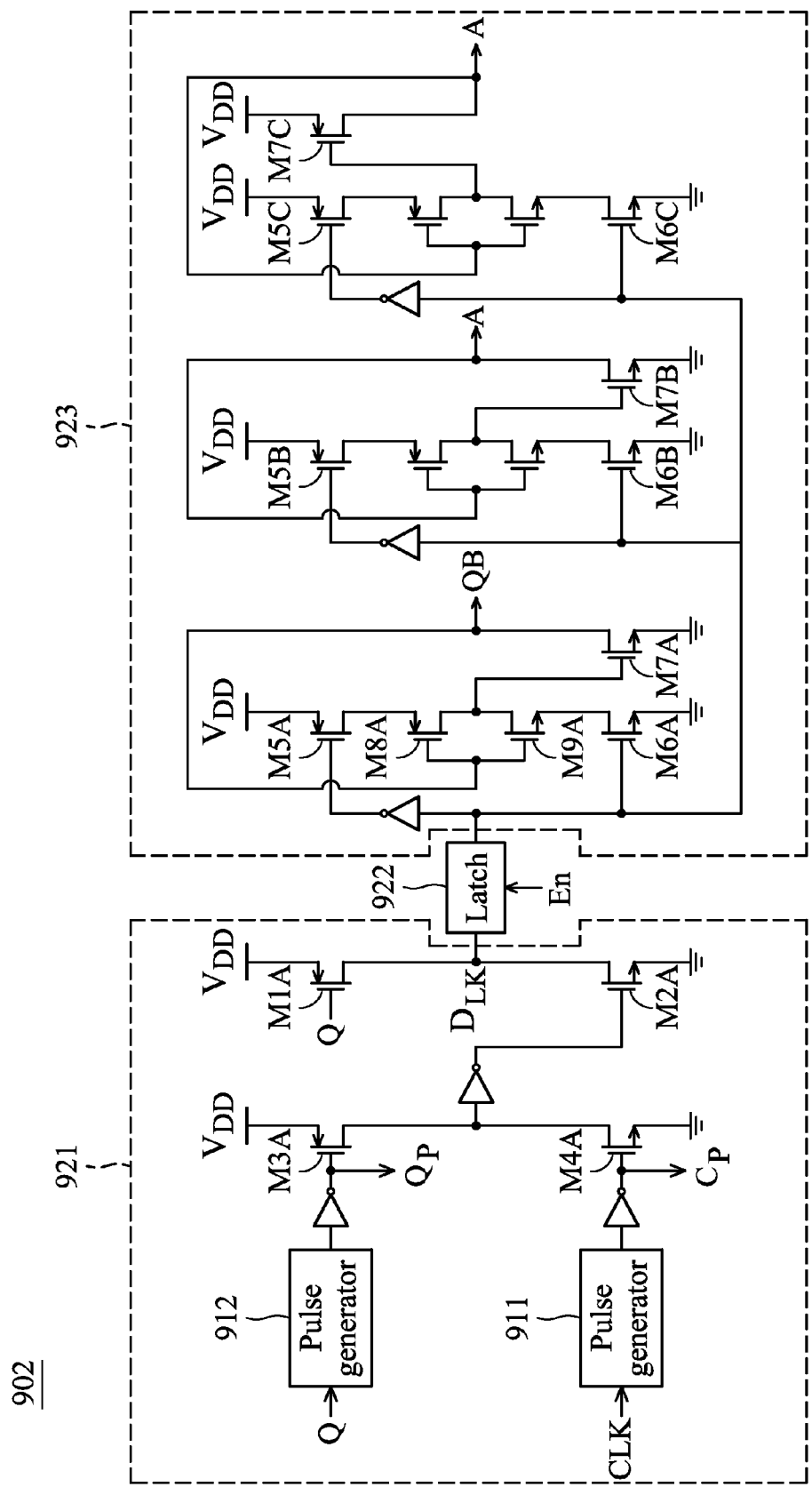
FIG. 9 shows a detailed circuit diagram of the leakage current suppression circuit according to an embodiment of the invention.
Figure 10A:
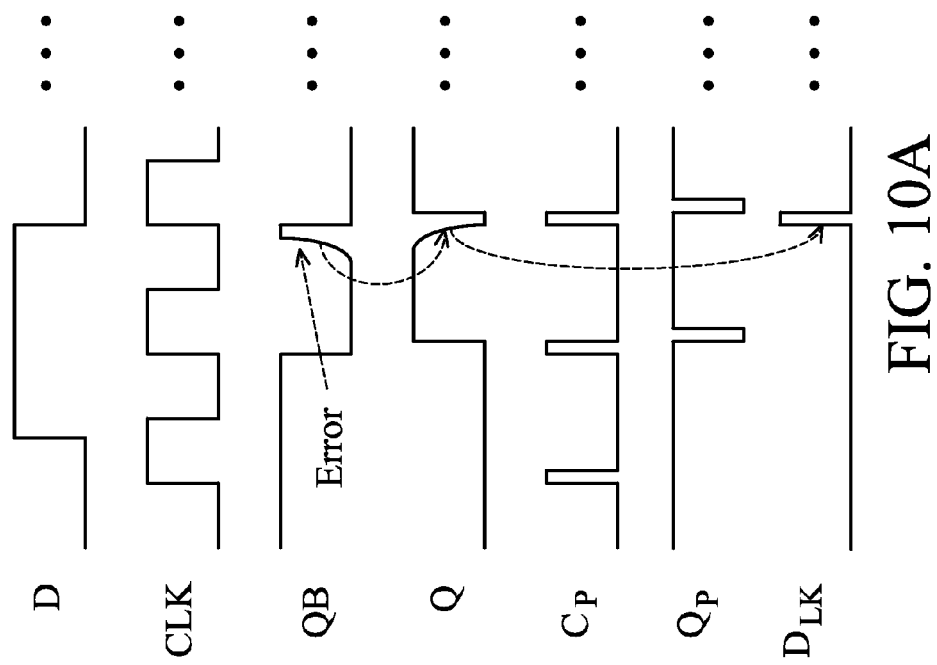
FIG. 10A is a timing diagram showing the signal waveforms of the signals in the leakage current detection stage according to an embodiment of the invention.
Figure 10B:
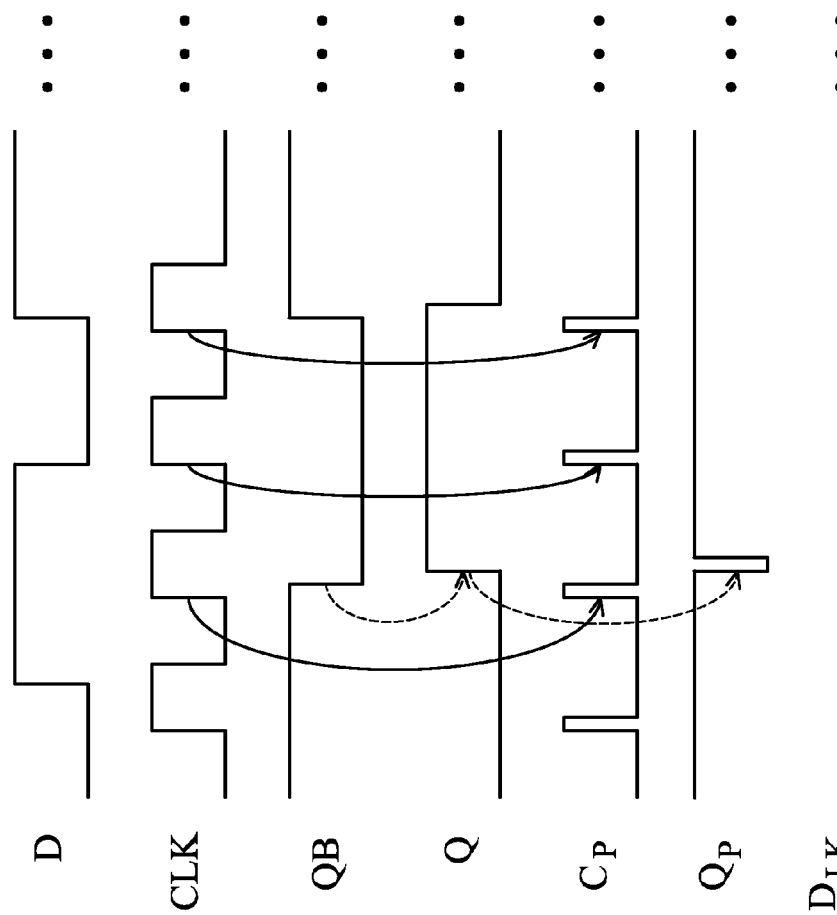
FIG. 10B is a timing diagram showing the signal waveforms of the signals in the leakage current compensation stage for a normal and self-repaired DFF according to an embodiment of the invention.
Figure 11:
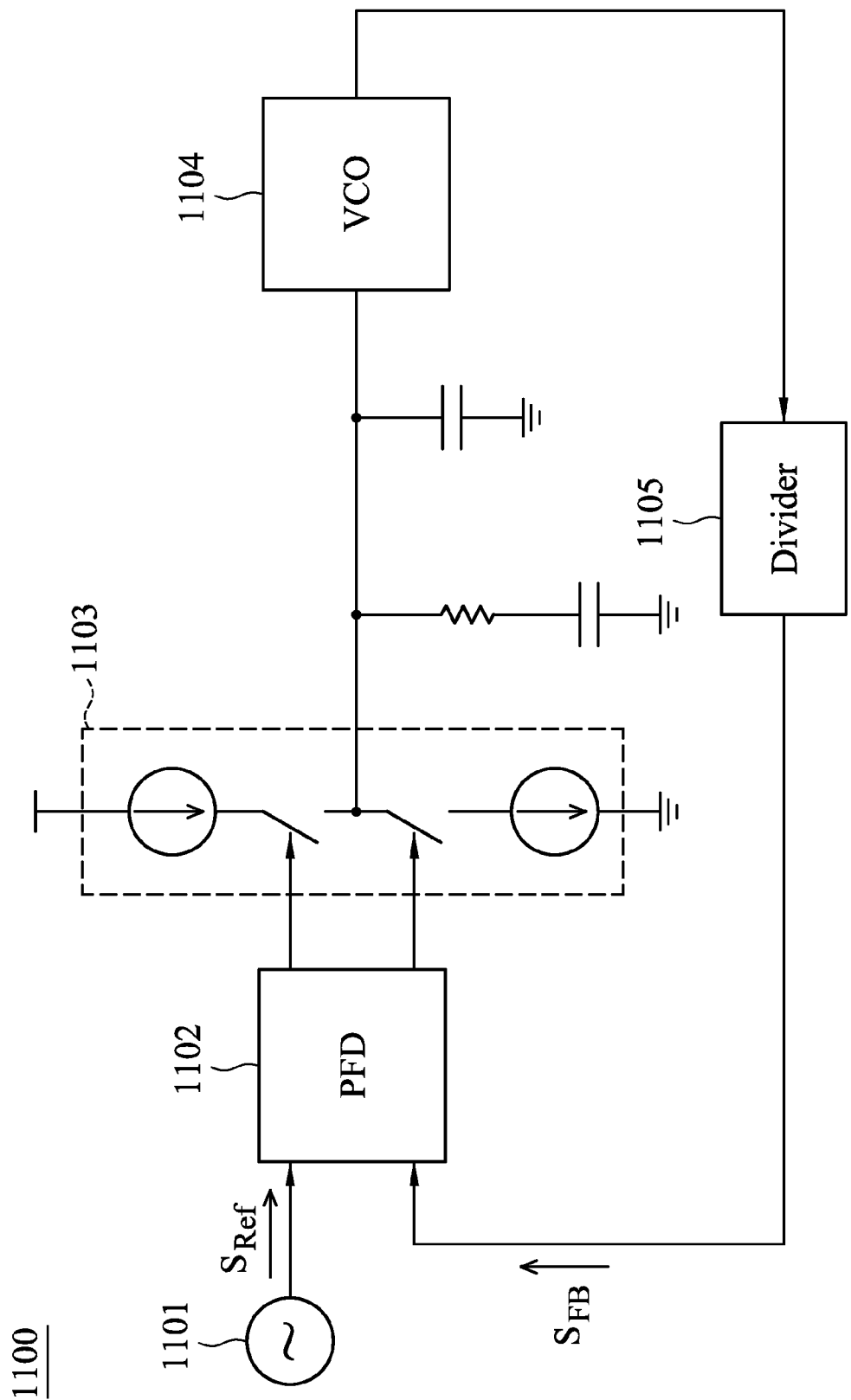
FIG. 11 shows a Phase Locked Loop (PLL) frequency synthesizer according to an embodiment of the invention.

FIG. 9 shows a detailed circuit diagram of the leakage current suppression circuit according to an embodiment of the invention. The leakage current suppression circuit 902 may comprise a detection circuit 921, a latch 922 and a compensation circuit 923. The detection circuit 921 receives the output signal Q and the clock signal CLK of the DFF, and detects whether the output error of the DFF has occurred, to generate a detection result $D_{LK}$. The latch 922 is coupled between the detection circuit 921 and the compensation circuit 923 to output the detection result $D_{LK}$ to the compensation circuit 923 according to an enable signal En. The compensation circuit 923 compensates for the leakage current according to the detection result $D_{LK}$ to correct the output error of the DFF. FIG. 10A is a timing diagram showing the signal waveforms of the signals in a leakage current detection stage according to an embodiment of the invention. FIG. 10B is a timing diagram showing the signal waveforms of the signals in a leakage current compensation stage for a normal and self-repaired DFF according to an embodiment of the invention. Referring to the signal waveforms shown in FIG. 10A and FIG. 10B, detailed operations of the leakage current suppression circuit is further introduced.

Referring first to FIG. 9 and FIG. 10A, the pulse generator 911 generates the pulse signal $C_P$ according to the rising edges of the clock signal CLK, where the short pulses of the pulse signal $C_P$ may be utilized to clean the voltage of the detection signal $D_{LK}$. Next, when the voltage of the output signal Q of the DFF becomes high (or the voltage of the inverse output signal QB becomes low), the transistor MIA is turned off. The pulse generator 912 may generate another short pulse in the pulse signal $Q_P$ so as to turn off the transistor M2A. Before the arrival of a next rising edge of the clock signal, the voltage of the inverse output signal QB is charged to high due to the leakage current. At the same time, the voltage of the output signal Q becomes low and the transistor M1A is turned on so as to pull the voltage of the detection signal $D_{LK}$ to high ($V_{DD}$). According to an embodiment of the invention, when the voltage of the detection signal $D_{LK}$ is high, it means that the output error of the DFF has occurred (as the 'Error' shown in the figure). Therefore, the compensation circuit may be activated in response to the detection result so as to compensate for the leakage current in a next clock period and to correct the output error. Note that in the embodiments of the invention, the size of the transistor M4A is larger than that of the transistor M3A. For example, the size of the transistor M2A may be 5 times as large as that of the transistor MIA. In this way, when the voltage of the output signal Q is at a correct logic low status (that is, the low voltage of the output signal Q is not caused by the leakage current), both the transistors M2A and M1A are turned on. At this time, the low voltage of the detection signal $D_{LK}$ may be held and the output error is not determined to have occurred.

Referring to FIG. 9 and FIG. 10B, assuming that the latch 922 is enabled so as to latch the current detection result of the detection signal $D_{LK}$, the high voltage of the detection signal $D_{LK}$, which means that the output error has already occurred, is transmitted to the compensation circuit 923. Note that the enable signal En of the latch 922 may be provided by an external device (not shown) so as to dynamically control activation of the compensation circuit. For example, the compensation circuit is activated when the output error has been detected, so as to prevent unnecessary power consumption. In order to compensate for the leakage current occurring at the inverse output terminal, suppose that the initial status of the inverse output signal is at a logic low status and the leakage current is charging the voltage at the inverse output terminal. Because the voltage at QB is low. $D_{LK}=1$ and the transistors M5A, M6A, M7A and M8A are turned on. In this way, the voltage at the inverse output terminal is gradually discharged back to logic low via the transistor M7A. Therefore, as shown in FIG. 10B, the voltage at the inverse output terminal QB is no longer at a logic high status due to erroneous charging of the leakage current. A plurality of stages of the compensation circuits may be coupled to the floating node (for example, the node A) so as to compensate for the leakage current causing the output error at the floating node. As shown in FIG. 9, the voltage at the node A may be discharged back to logic low via the transistor M7B or charged back to logic high via the transistor M7C.

Figure 1:
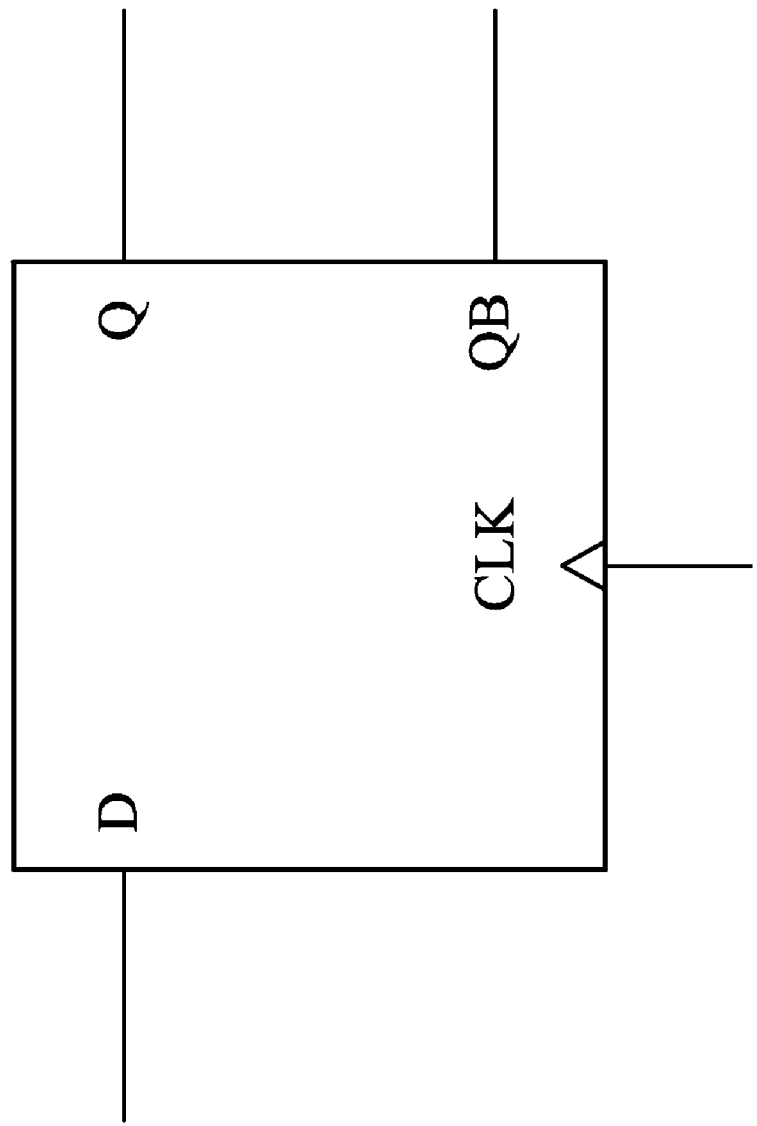
FIG. 1 shows a conventional D flip-flop.

The proposed leakage current suppression circuit may be applied to any circuit comprising a DFF and utilized to detect the output error of the DFF caused by the leakage current and compensate for the leakage current so as to correct the output error. FIG. 1 shows a Phase Locked Loop (PLL) frequency synthesizer according to an embodiment of the invention. The PLL frequency synthesizer may be may be utilized to generate a signal with a frequency that is a multiple of that of a reference signal $S_{Ref}$ generated by the crystal oscillator 1101. In the PLL frequency synthesizer 1100, the Phase Frequency Detector (PFD) 1102 compares the phase difference between the reference signal $S_{Ref}$ and the output signal $S_{FB}$ of the divider 1105, and outputs the comparison result to the charge pump 1103. The charge pump 1103 charges or discharges in accordance with the comparison result so as to control the input voltage of the Voltage Controlled Oscillator (VCO) 1104. The VCO 1104 controls the oscillating frequency of the output signal according to the input voltage so as to generate the signal having a frequency as N times of that of the reference signal $S_{Ref}$. The output signal of VCO 1104 is the frequency divided by the divider 1105, wherein thereafter the feedback signal $S_{FB}$ is generated to the PFD 1102.

Figure 12:
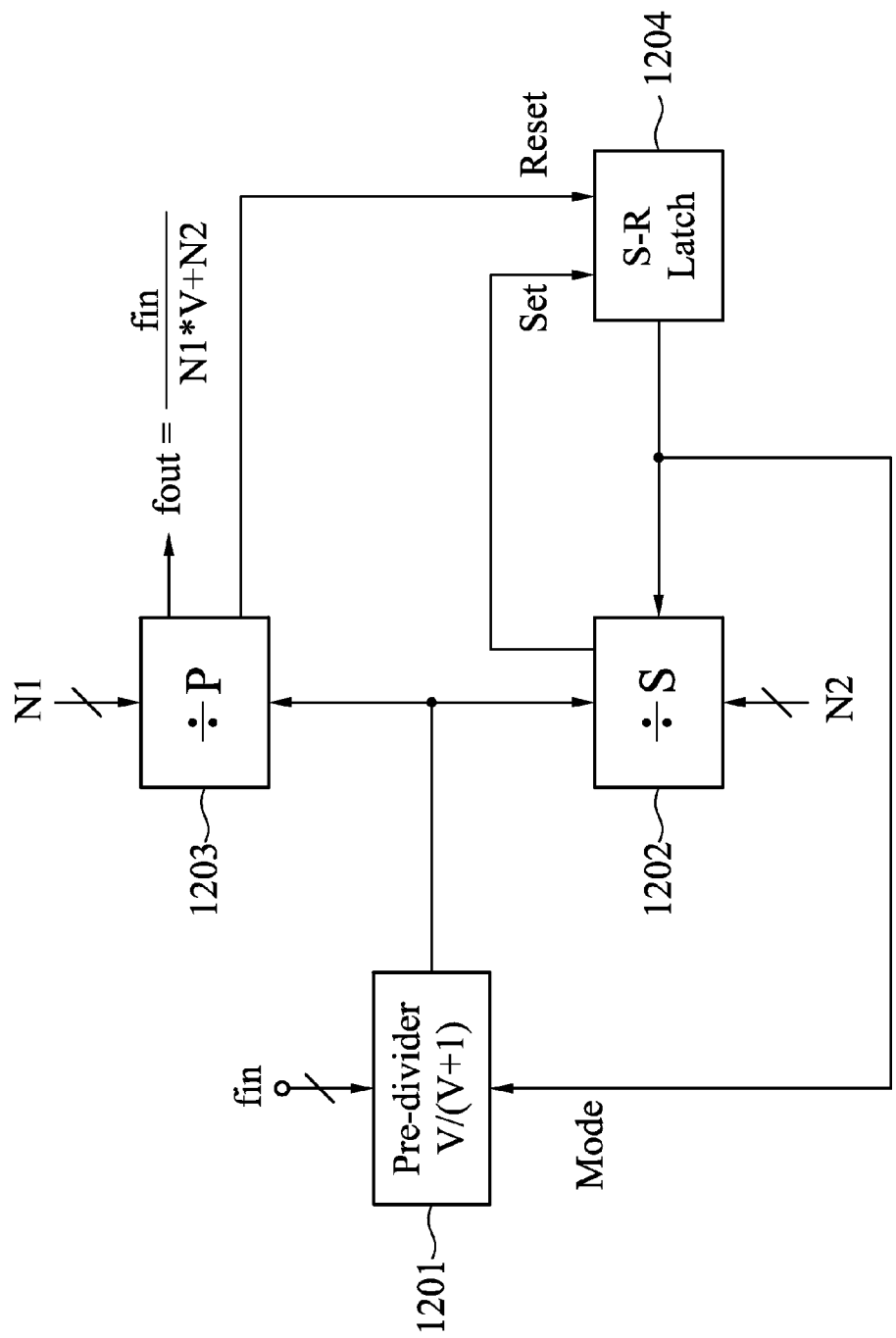
FIG. 12 shows a block diagram of a divider according to an embodiment of the invention.

According to an embodiment of the invention, the divider 1105 may comprise one or more DFFs. Therefore, the proposed leakage current suppression circuit may be utilized in the divider 1105 for detecting the output error(s) of the DFF(s) caused by the leakage current and compensate for the leakage current so as to correct the output error(s). FIG. 12 shows a block diagram of a divider according to an embodiment of the invention. To begin, when the signal Mode=0, the pre-divider 1201 divides the input signal fin by (V+1) and the counters 1202 and 1203 start to count synchronously. When the counter 1202 has counted for N2 clock periods, the set signal Set is issued so as to set the S-R latch 1204 to make the voltage level of the signal Mode to become 1. Then, the pre-divider 1201 is switched to divide the input signal fin by V, and the counter 1202 is deactivated. However, the counter 1203 is kept counting (because N1>N2) until the counter 1203 has counted for N1 clock periods. After the counter 1203 has counted for N1 clock periods, a reset signal Reset is generated so as to reset the S-R latch 1204 to make the voltage level of the signal Mode to become 0, and a new cycle as previously described begins again. During one cycle, a pulse of the output signal is generated when the counters have counted for [N2×(V+1)+(N1−N2)×V]=N1×V+N2 clock periods. Therefore, relationship between the frequencies of the input signal and the output signal may be represented by fin=(N1×V+N2)fout.

Figure 13:
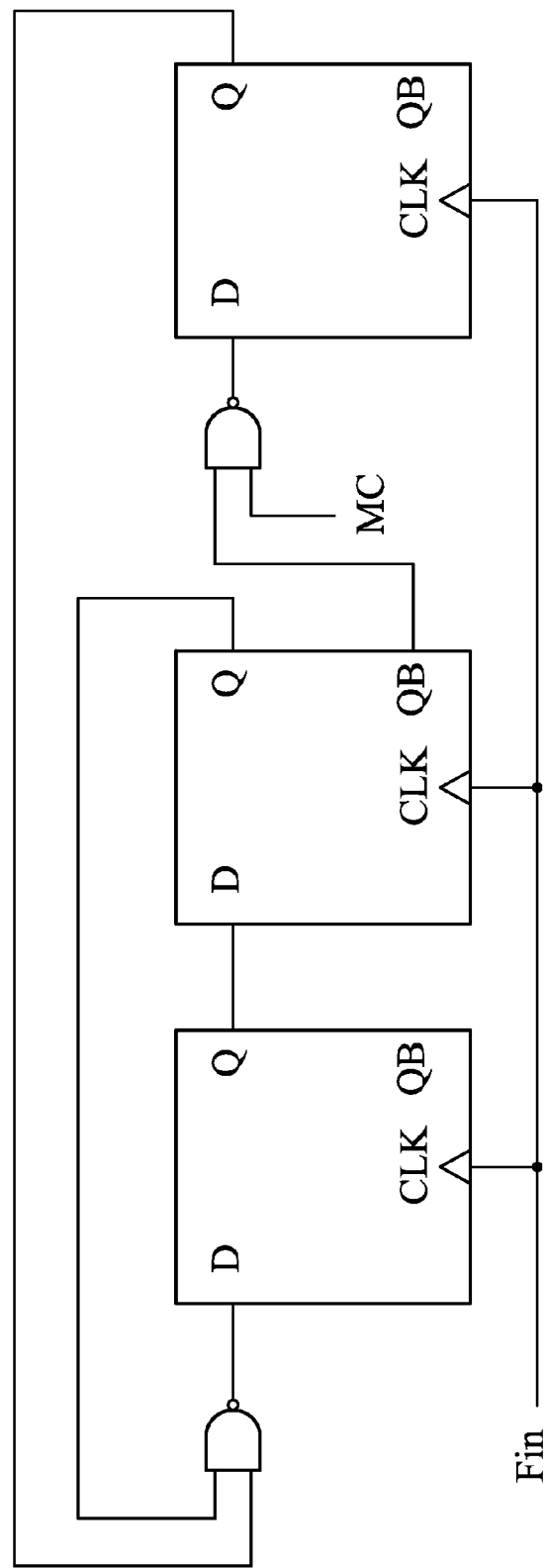
FIG. 13 shows a block diagram of a 4/5 pre-divider according to an embodiment of the invention.

According to an embodiment of the invention, the leakage current suppression circuit may be utilized in the pre-divider of the divider so as to detect the output error of the DFF caused by the leakage current and compensate for the leakage current to correct the output error. FIG. 13 shows a block diagram of a 4/5 pre-divider according to an embodiment of the invention. As shown in FIG. 13, the pre-divider 1300 may comprise three DFFs. In order to correct the output errors of the DFFs caused by the leakage current, the proposed leakage current suppression circuit as shown in FIG. 3 may be coupled to each DFF, respectively. In this manner, the output errors of the DFFs caused by the leakage current may be effectively suppressed.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. A leakage current suppression circuit for detecting an output error caused by a leakage current flowing through at least a floating node of a D Flip-flop (DFF) and compensating for the leakage current so as to correct the output error, comprising:
    a detection circuit for receiving an output signal and a clock signal of the DFF, and detecting whether the output error has occurred, to generate a detection result; wherein the detection circuit comprises:
        a first pulse generator for generating a plurality of first pulses according to the clock signal;
        a second pulse generator for generating a plurality of second pulses according to the output signal;
        a first switch coupled between a first supply voltage and a detection node and turned on or off according to a voltage of the output signal; and
        a second switch coupled between a second supply voltage and the detection node and turned on or off according to voltages of the plurality of first pulses and the plurality of second pulses, wherein the detection circuit generates the detection result at the detection node according to on/off statuses of the first and second switches; and
    a compensation circuit for compensating for the leakage current according to the detection result to correct the output error.

2. The leakage current suppression circuit as claimed in claim 1, wherein the floating node is an inverse output terminal of the DFF, the compensation circuit comprises a first stage of the compensation circuit compensating for the leakage current flowing through the inverse output terminal, and when the detection result indicates that the output error has already occurred, the first stage of the compensation circuit discharges a voltage at the inverse output terminal through a first discharge circuit so as to reset an inverse output signal generated at the inverse output terminal.

3. The leakage current suppression circuit as claimed in claim 2, wherein the compensation circuit further comprises a second stage of the compensation circuit and a third stage of the compensation circuit for compensating for leakage current flowing through another floating node of the DFF, and when the detection result indicates that the output error has already occurred, the second stage of the compensation circuit discharges a voltage at the floating node through a second discharge circuit, or the third stage of the compensation circuit charges the voltage at the floating node through a charge circuit so as to reset the voltage at the floating node.

4. The leakage current suppression circuit as claimed in claim 1, wherein the first pulse generator comprises:
    a first inverter for receiving the clock signal; and
    a logic gate for performing a logic operation according to an output signal of the first inverter and the clock signal to generate the plurality of first pulses.

5. The leakage current suppression circuit as claimed in claim 1, wherein the detection circuit further comprises:
    a third switch coupled between the first supply voltage and the second switch and turned on or off according to the voltages of the plurality of first pulses; and
    a fourth switch coupled between the second supply voltage and the second switch and turned on or off according to the voltages of the plurality of second pulses.

6. The leakage current suppression circuit as claimed in claim 5, wherein the first switch, the second switch, the third switch and the fourth switch are respectively a transistor.

7. The leakage current suppression circuit as claimed in claim 2, wherein the first stage of the compensation circuit further comprises:
    a second inverter coupled to the inverse output terminal for receiving the inverse output signal,
    wherein the first discharge circuit comprises a first transistor coupled between the inverse output terminal, the second inverter and the second supply voltage and is turned on according to an output signal of the second inverter so as to discharge the voltage at the inverse output terminal to the second supply voltage.

8. The leakage current suppression circuit as claimed in claim 3, wherein the second stage of the compensation circuit further comprises:
    a third inverter coupled to the floating node,
    wherein the second discharge circuit comprises a second transistor coupled between the floating node, the third inverter and the second supply voltage, and is turned on according to an output signal of the third inverter so as to discharge the voltage at the floating node to the second supply voltage, and wherein the third stage of the compensation circuit further comprises:
a fourth inverter, coupled to the floating node,
wherein the charge circuit comprise a third transistor coupled between the floating node, the fourth inverter and the first supply voltage, and is turned on according to an output signal of the fourth inverter so as to charge the voltage at the floating node to the first supply voltage.

9. The leakage current suppression circuit as claimed in claim 7, wherein the first stage of the compensation circuit further comprises:

a fifth switch coupled between the first supply voltage and the second inverter; and
a sixth switch coupled between the second supply voltage and the second inverter, wherein the fifth switch and the sixth switch are respectively turned on or off according to the detection result so as to turn on or off the second inverter.

10. The leakage current suppression circuit as claimed in claim 1, further comprising a latch coupled between the detection circuit and the compensation circuit to output the detection result to the compensation circuit according to an enable signal.

* * * * *